US006632731B2

(12) United States Patent
Ma et al.

(10) Patent No.: US 6,632,731 B2
(45) Date of Patent: Oct. 14, 2003

(54) STRUCTURE AND METHOD OF MAKING A SUB-MICRON MOS TRANSISTOR

(75) Inventors: Yanjun Ma, Vancouver, WA (US); David Russell Evans, Beaverton, OR (US); Yoshi Ono, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/783,760

(22) Filed: Feb. 14, 2001

(65) Prior Publication Data

US 2001/0009784 A1 Jul. 26, 2001

Related U.S. Application Data

(63) Continuation-in-part of application No. 09/004,991, filed on Jan. 9, 1998, now Pat. No. 6,274,421.

(51) Int. Cl.[7] .......................................... H01L 21/3205
(52) U.S. Cl. .................... 438/585; 438/197; 438/299; 438/301; 257/344; 257/408; 257/411; 257/346; 257/336
(58) Field of Search ................................. 438/585, 197, 438/299, 301, 241; 257/344, 408, 411, 346, 336

(56) References Cited

U.S. PATENT DOCUMENTS

| 4,732,871 A | * | 3/1988 | Buchmann et al. ........... 216/37 |
| 4,849,376 A | * | 7/1989 | Balzan et al. ................ 438/582 |
| 5,196,357 A | * | 3/1993 | Boardman et al. .......... 438/304 |
| 5,334,545 A | * | 8/1994 | Caviglia ...................... 438/592 |
| 5,949,105 A | * | 9/1999 | Moslehi ....................... 257/336 |
| 6,069,387 A | * | 5/2000 | Gardner ....................... 438/183 |
| 6,235,564 B1 | * | 5/2001 | Itoh et al. .................... 438/183 |

FOREIGN PATENT DOCUMENTS

| JP | 05013456 A | * | 1/1993 | |
| JP | 2000091350 A | * | 3/2000 | ......... H01L/21/338 |

OTHER PUBLICATIONS

Van Zant, Microchip Fabrication, 1997, McGraw–Hill, pp. 389, 394.*
Chatterjee et al., Sub–100nm Gate Length Metal Gate NMOS Transistors Fabricated by a Replacement Gate Process, International Electron Devices Meeting, Dec. 7 –10, 1997, pp 821–824.

* cited by examiner

Primary Examiner—Caridad Everhart
Assistant Examiner—V. Yevsikov
(74) Attorney, Agent, or Firm—David C. Ripma; Matthew D. Rabdau; Scott C. Krieger

(57) ABSTRACT

A method of fabricating a sub-micron MOS transistor includes preparing a substrate, including isolating an active region therein; depositing a gate oxide layer; depositing a first selective etchable layer over the gate oxide layer; depositing a second selective etchable layer over the first selective etchable layer; etching the structure to undercut the first selective etchable layer; implanting ions in the active region to form a source region and a drain region; depositing and planarizing the oxide; removing the remaining first selective etchable layer and the second selective etchable layer; depositing a gate electrode; and depositing oxide and metallizing the structure. A sub-micron MOS transistor includes a substrate; and an active region, including a gate region having a length of less than one micron; a source region including a LDD source region; and a drain region including a LDD drain region.

14 Claims, 2 Drawing Sheets

STRUCTURE AND METHOD OF MAKING A SUB-MICRON MOS TRANSISTOR

CROSS REFERENCE TO RELATED APPLICATIONS

This application is a continuation-in-part of application Ser. No. 09/004,991, filed Jan. 9, 1998, now issued as U.S. Pat. No. 6,274,421, entitled "Method of Making Metal Gate Sub-Micron MOS Transistor," invented by Hsu et al.

FIELD OF THE INVENTION

This invention relates to MOS Transistor and IC fabrication method, and specifically to the use of a nitride undercut to form a sub-micron MOS.

BACKGROUND OF THE INVENTION

The use of chemical etching to provide a controllable undercut has been used to produce conventional MOS transistors, which is known as a "T-gate" structure. A nitride undercut, using phosphoric acid, has been used specifically in the fabrication of triple implanted bipolar transistors, however, this process is not widely used now because of controllability issues required to manufacture ICs using current technology. The nitride undercutting process may remain a useful process in a certain application, such as in the manufacture of sub-micron MOS transistors.

Lightly doped (LDD) structures are widely used in state-of-the-art IC fabrication. The usual LDD process requires two implantation steps, however, one of the implantation steps is eliminated using the LDD method of the invention.

SUMMARY OF THE INVENTION

A method of fabricating a sub-micron MOS transistor includes preparing a substrate, including isolating an active region therein; depositing a gate oxide layer; depositing a first selective etchable layer over the gate oxide layer; depositing a second selective etchable layer over the first selective etchable layer; etching the structure to undercut the first selective etchable layer; implanting ions in the active region to form a source region and a drain region; depositing and planarizing the oxide; removing the remaining first selective etchable layer and the second selective etchable layer; depositing a gate electrode; and depositing oxide and metallizing the structure A sub-micron MOS transistor includes a substrate; and an active region, including a gate region having a length of less than one micron; a source region including a LDD source region; and a drain region including a LDD drain region.

An object of the invention is to provide a method of fabrication for sub-micron transistors Another object of the invention is to provide a simplified LDD process This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

An n-channel MOS transistor is used as an example to describe the method of the invention, however, the structure and fabrication process is also applicable to p-channel MOS transistors and CMOS integration.

Figure 1:
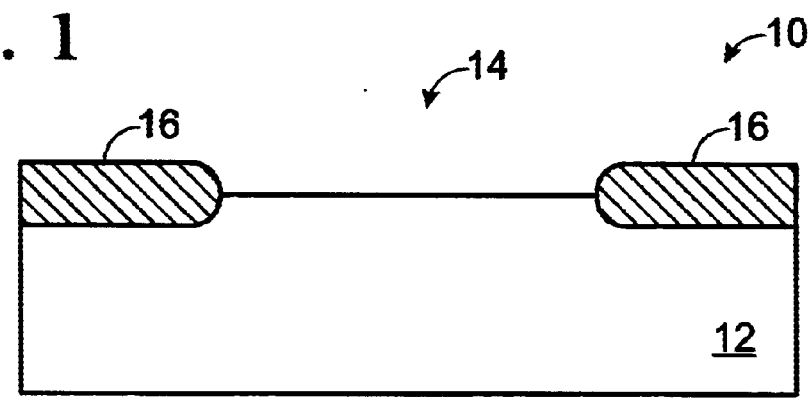
FIGS. 1–4 depicts steps in the method of the invention.

Referring to FIG. 1, a structure 10 constructed according to the method of the invention is fabricated using state-of-the-art processes on a p-type substrate 12 to form an n-well, a p-well, to adjust the voltage threshold in an active region 14, and to provide device isolation, as by oxide regions 16.

Figure 2:
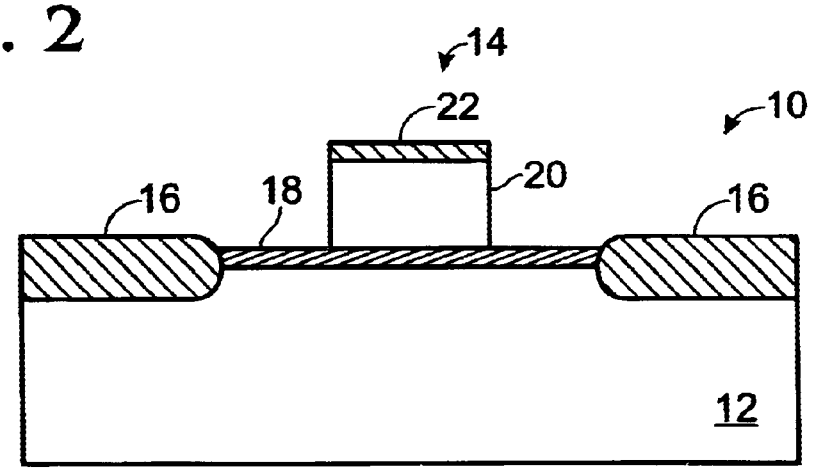

Turning to FIG. 2, a gate oxide layer 18 is formed, and a layer of silicon nitride ($Si_3N_4$), or polysilicon, 20, also refereed to herein as a first selective etchable layer is deposited to a thickness of between about 200 nm to 500 nm. A tin layer of oxide 22, also referred to herein as a second selective etchable layer, is deposited over the nitride layer to a thickness of between about 20 mm to 100 mm.

This is followed by photo lithography and anisotropic plasma etching of oxide layer 22 and silicon nitride, or polysilicon, layer 20, or polysilicon, wherein the etching stops at the level of gate oxide 18. Gate oxide layer 18 may be partially etched, or may be completely removed during this etching process. The remaining silicon nitride, or polysilicon, layer forms a replacement cast for a gate electrode, which will be formed in a subsequent step. Any remaining, photoresist is then removed, resulting in the structure shown generally at 10 in FIG. 2

Figure 3:
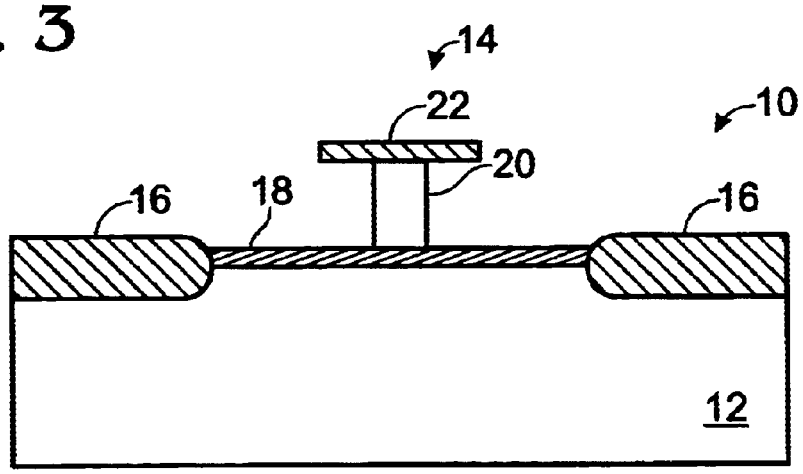
Figure 4:
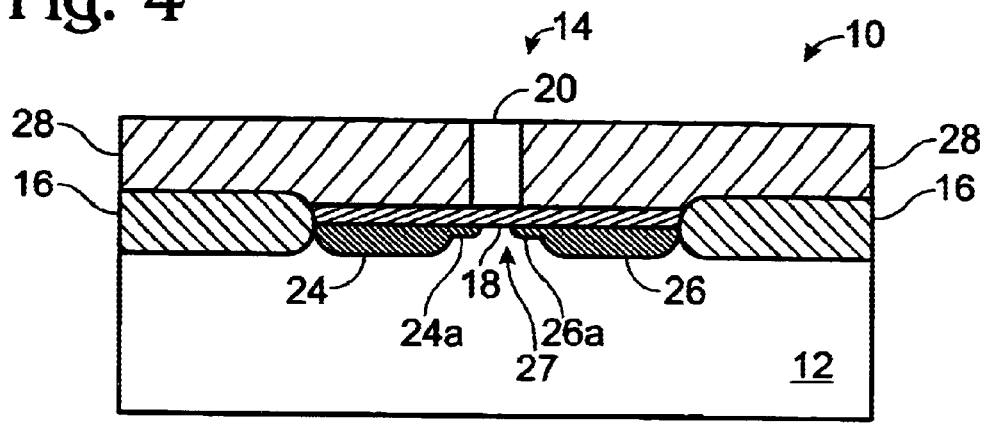

Referring now to FIG. 3, nitride layer 20 is partially etched using phosphoric acid, which has a high selectivity over oxide, i.e., the phosphoric acid will remove silicon nitride considerably faster than it will remove silicon oxide, resulting in the structure of FIG. 3. The gate length is shortened by two-times the thickness of the nitride etched, resulting in a device having a shorter channel, for instance, a gate length of 100 nm results from an initial nitride deposition having a length of 200 nm, of which 50 nm is removed by etching.

In the case where polysilicon is used as a replacement cast, the gate oxide must not be completely removed during the gate etching process. Polysilicon may be selectively etched by using diluted $HNO_3/HF$ solution. Additionally, the oxide layer 22 may be replaced with silicon nitride to achieve higher etching selectivity. In this case, silicon nitride is deposited to a thickness of between about 20 nm to 100 nm.

A source region 24 and a drain region 26 is formed in active region 16 by ion implantation adjacent a gate region 27. In the preferred embodiment, Arsenic ions are implanted at a dose of between about $1 \cdot 10^{15}$ $cm^{-2}$ to $5 \cdot 10^{15}$ $cm^{-2}$, and an energy level of between about 30 keV to 70 keV. Because of overhanging oxide 22, the implantation depth and dose is reduced in the region under the overhanging oxide, which results in an LDD source region 24a and an LDD drain region 26a adjacent gate region 27, without an additional implantation step. The implanted profile in this region is a function of implant energy, dose, and the thickness of the oxide. For instance, the ion concentration in the source region 24 and drain region 26 is between about $1 \cdot 10^{20}$ $cm^{-3}$ to $1 \cdot 10^{21}$ $cm^{-3}$, while the ion concentration in LDD source region 24a and LDD drain region 26a is between about $5 \cdot 10^{18}$ $cm^{-3}$ to $5 \cdot 10^{19}$ $cm^{-3}$ The gate may be heavily doped polysilicon or metal.

The next step is to CVD an oxide layer 28 to a thickness of between about 15 times to two times the thickness of silicon nitride layer 20 The structure is planarized by CMP, stopping at the level of silicon nitride layer 20. A high selectivity slurry is desirable for this process. Nitride layer 20 is etched to remove it, and doped polysilicon or metal 30 is deposited and CMP planarized to form a gate electrode.

Figure 5:
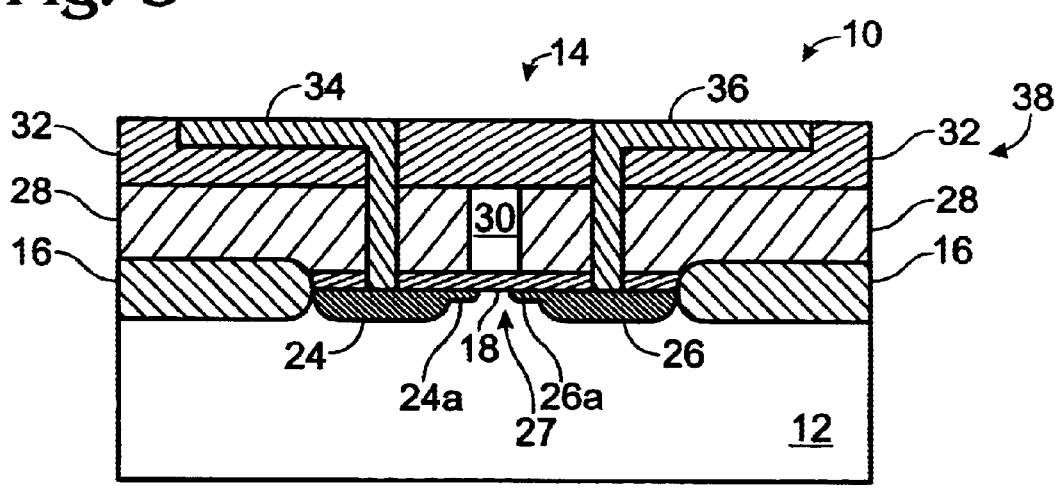
FIG. 5 depicts a sub-micron MOS transistor constructed according to the method of the invention

An oxide layer 32 is deposited by CVD, and a source electrode 34 and a drain electrode is formed, resulting in the structure shown generally at 38 in FIG. 5.

The remainder of the process proceeds as described in an earlier patent disclosure by Hsu and Evans describing the nitride replacement or "cast" process. For conventional polysilicon gate fabrication, standard processing, which is well known to those of ordinary skill in the art, is performed.

Thus, a structure and a method for fabricating a sub-micron MOS transistor using a silicon nitride or polysilicon undercut process has been disclosed. It will be appreciated that further variations and modifications thereof may be made within the scope of the invention as defined in the appended claims.

We claim:

1. A method of fabricating a sub-micron MOS transistor comprising:
   preparing a substrate, including isolating an active region therein;
   depositing a gate oxide layer;
   depositing a first selective etchable layer over the gate oxide layer;
   depositing a second selective etchable layer over the first selective etchable layer;
   etching the structure to undercut the first selective etchable layer;
   implanting ions in the active region simultaneously to form a source region and a LDD source region, and simultaneously to form a drain region and a LDD drain region;
   removing the remaining first selective etchable layer and the second selective etchable layer;
   depositing a gate electrode; and
   depositing oxide and metallizing the structure.

2. The method of claim 1 wherein said depositing a first selective etchable layer includes depositing a layer of silicon nitride, and wherein said depositing a second selective etchable layer includes depositing a layer of silicon oxide.

3. The method of claim 1 wherein said depositing a first selective etchable layer includes depositing a layer of polysilicon, and wherein said depositing a second selective etchable layer includes depositing a layer of silicon nitride.

4. The method of claim 1 wherein said depositing a first selective etchable layer includes depositing a layer of polysilicon, and wherein said depositing a second selective etchable layer includes depositing a layer of silicon oxide.

5. The method of claim 1 wherein said depositing a gate electrode includes depositing a layer of material taken from the group of materials consisting of doped polysilicon and metal.

6. The method of claim 1 wherein said implanting includes implanting Arsenic ions at a dose of between about $1 \cdot 10^{15}$ cm$^{-2}$ to $5 \cdot 10^{15}$ cm$^{-2}$, and an energy level of between about 30 keV to 70 keV.

7. The method of claim 1 wherein said implanting includes implanting ions to provide an ion concentration in the source region and in the drain region of between about $1 \cdot 10^{20}$ cm$^{-3}$ to $1 \cdot 10^{21}$ cm$^{-3}$, and wherein the ion concentration the LDD source region and in the LDD drain region is between about $5 \cdot 10^{18}$ cm$^{-3}$ to $5 \cdot 10^{18}$ cm$^{-3}$.

8. A method of fabricating a sub-micron MOS transistor comprising:
   preparing a substrate, including isolating an active region therein;
   depositing a gate oxide layer in a gate region;
   depositing a first selective etchable layer over the gate oxide layer;
   depositing a second selective etchable layer over the first selective etchable layer;
   etching the structure to undercut the first selective etchable layer;
   implanting ions in the active region to form a source region and a drain region, including simultaneously forming a LDD source region and an LDD drain region adjacent the gate region;
   removing the remaining first selective etchable layer and the second selective etchable layer.
   depositing a gate electrode; and
   depositing oxide and metallizing the structure.

9. The method of claim 8 wherein said depositing a first selective etchable layer includes depositing a layer of silicon nitride to a thickness of between about 200 nm to 500 nm, and wherein said depositing a second selective etchable layer includes depositing a layer of silicon oxide to a thickness of between about 20 nm to 100 nm.

10. The method of claim 8 wherein said depositing a first selective etchable layer includes depositing a layer of polysilicon, and wherein said depositing a second selective etchable layer includes depositing a layer of silicon nitride, wherein the thickness of both layers is between about 200 nm and 500 nm.

11. The method of claim 8 wherein said depositing a first selective etchable layer includes depositing a layer of polysilicon to a thickness of between about 200 nm to 500 nm, and wherein said depositing a second selective etchable layer includes depositing a layer of silicon oxide to a thickness of between about 20 nm to 100 nm.

12. The method of claim 8 wherein said depositing a gate electrode includes depositing a layer of material taken from the group of materials consisting of doped polysilicon and metal.

13. The method of claim 8 wherein said implanting includes implanting Arsenic ions at a dose of between about $1 \cdot 10^{15}$ cm$^{-2}$ to $5 \cdot 10^{15}$ cm$^{-2}$, and an energy level of between about 30 keV to 70 keV.

14. The method of claim 8 wherein said implanting includes implanting ions to provide an ion concentration in the source region and in the drain region of between about $1 \cdot 10^{20}$ cm$^{-3}$ to $1 \cdot 10^{21}$ cm$^{-3}$, and wherein the ion concentration the LDD source region and in the LDD drain region is between about $5 \cdot 10^{18}$ cm$^{-3}$ to $5 \cdot 10^{19}$ cm$^{-3}$.

* * * * *